(12) United States Patent
Shih et al.

(10) Patent No.: US 9,620,077 B2
(45) Date of Patent: Apr. 11, 2017

(54) DISPLAY PANEL STRUCTURE

(71) Applicant: InnoLux Corporation, Miao-Li County (TW)

(72) Inventors: Chien-Feng Shih, Miao-Li County (TW); Yu-Hsiang Chiu, Miao-Li County (TW); Liang-Yun Chang, Miao-Li County (TW); Sheng-Feng Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 43 days.

(21) Appl. No.: 14/676,167

(22) Filed: Apr. 1, 2015

(65) Prior Publication Data
US 2015/0325593 A1  Nov. 12, 2015

Related U.S. Application Data

(60) Provisional application No. 61/991,254, filed on May 9, 2014.

(30) Foreign Application Priority Data

Jul. 9, 2014  (TW) .............................. 103123590 A

(51) Int. Cl.
*H01L 27/12* (2006.01)
*G09B 5/00* (2006.01)
(Continued)

(52) U.S. Cl.
CPC ................. *G09G 5/00* (2013.01); *G09G 3/20* (2013.01); *H01L 27/0292* (2013.01);
(Continued)

(58) Field of Classification Search
USPC .......................................... 345/206; 257/347
(Continued)

(56) References Cited

U.S. PATENT DOCUMENTS 8,638,280 B2 * 1/2014 Nonaka ..................... G09G 3/20
345/76
2009/0102758 A1 * 4/2009 Anzai .................. G09G 3/3225
345/76

(Continued)

FOREIGN PATENT DOCUMENTS

TW  201009467 A  3/2010
TW  201039032 A  11/2010

*Primary Examiner* — Jennifer Mehmood
*Assistant Examiner* — Deeprose Subedi
(74) *Attorney, Agent, or Firm* — Bacon & Thomas, PLLC

(57) ABSTRACT

A display panel structure includes a substrate, plural gate lines and data lines arranged on the substrate, plural pixel units, and plural dummy pixel units. The substrate has a display region and a peripheral region surrounding the display region. The gate lines and data lines are extended from the display region to the peripheral region. The pixel units are disposed at the display region. The dummy pixel units are disposed at the peripheral region, and include a first region, a second region, and a third region. The dummy pixel units of the first region and the second region are arranged along a first direction and a second direction, respectively. The dummy pixel units of the third region are arranged between the first and second regions. The dummy pixel units of the third region include one of the gate lines and one of the data lines.

17 Claims, 12 Drawing Sheets

(51) Int. Cl.
*G09G 5/00* (2006.01)
*H01L 29/423* (2006.01)
*H01L 29/417* (2006.01)
*G09G 3/20* (2006.01)
*H01L 27/02* (2006.01)

(52) U.S. Cl.
CPC .......... *H01L 27/124* (2013.01); *H01L 29/417* (2013.01); *H01L 29/41733* (2013.01); *H01L 29/423* (2013.01); *H01L 29/42324* (2013.01); *H01L 29/42384* (2013.01); *G09G 2300/04* (2013.01); *G09G 2300/0413* (2013.01); *G09G 2300/0426* (2013.01)

(58) Field of Classification Search
IPC ..................... H01L 27/124,27/0292, 29/42324, 29/41733, 29/42384; G09G 2300/04, 5/00
See application file for complete search history.

(56) References Cited

U.S. PATENT DOCUMENTS

| | | | | |
|---|---|---|---|---|
| 2009/0102824 A1* | 4/2009 | Tanaka | .............. | G02F 1/134309 345/205 |
| 2010/0289994 A1* | 11/2010 | Nonaka | ............. | G02F 1/133514 349/108 |
| 2013/0056761 A1 | 3/2013 | Kang et al. | | |

* cited by examiner

DISPLAY PANEL STRUCTURE

BACKGROUND OF THE INVENTION

1. Field of the Invention

The present invention relates to a display panel structure.

2. Description of Related Art

In many kinds of flat displays, it is obvious that the display panel generally has a shape of rectangle. As shown in FIG. 1, the dummy pixel circuit provided on a rectangular display panel usually consists of dummy gate lines in cooperation with data lines or dummy data lines in cooperation with gate lines for forming the dummy pixel unit structure 91. However, when there is a need to provide different shape of display panel structure, the above dummy pixel circuit is not suitable.

Therefore, it is desirable to provide a free shaped display panel structure, without being limited in rectangular display panel structure, so that different dummy pixel unit structure can be arranged on the free shaped display panel structure so as to provide the effect of electrostatic discharge protection.

SUMMARY OF THE INVENTION

The object of the present invention is to provide a display panel structure, such that a free shaped display panel structure can be provided with suitable dummy pixel units, dummy gate lines, and dummy date lines thereby providing the effect of electrostatic discharge protection.

To achieve the object, there is provided a display panel structure, which comprises: a substrate having a display region and a peripheral region, the peripheral region surrounding the display region; a plurality of gate lines arranged in parallel on the substrate along a first direction, wherein the plurality of gate lines are extended from the display region to the peripheral region; a plurality of data lines arranged in parallel on the substrate along a second direction, which is not parallel with the first direction, wherein the plurality of data lines are extended from the display region to the peripheral region; a plurality of pixel units disposed at the display region, each of the plurality of the pixel units being defined by two adjacent gate lines and two adjacent data lines; and a plurality of dummy pixel units disposed at the peripheral region including a first region of the plurality of dummy pixel units, a second region of the plurality of dummy pixel units, and a third region of the plurality of dummy pixel units, wherein the dummy pixel units of the first region are arranged along the first direction, the dummy pixel units of the second region are arranged along the second direction, and the dummy pixel units of the third region are arranged between the first region and the second region, and wherein the dummy pixel units of the third region include one of the plurality of gate lines and one of the plurality of data lines.

Based on the special structure and diversity of the dummy pixel units in accordance with the present invention, it is able to provide a free shaped display panel structure without being limited in rectangle shape. Furthermore, when a product needs a special shaped display panel structure, the display panel structure of the present invention could be used.

DETAILED DESCRIPTION OF THE PREFERRED EMBODIMENT

Figure 1:
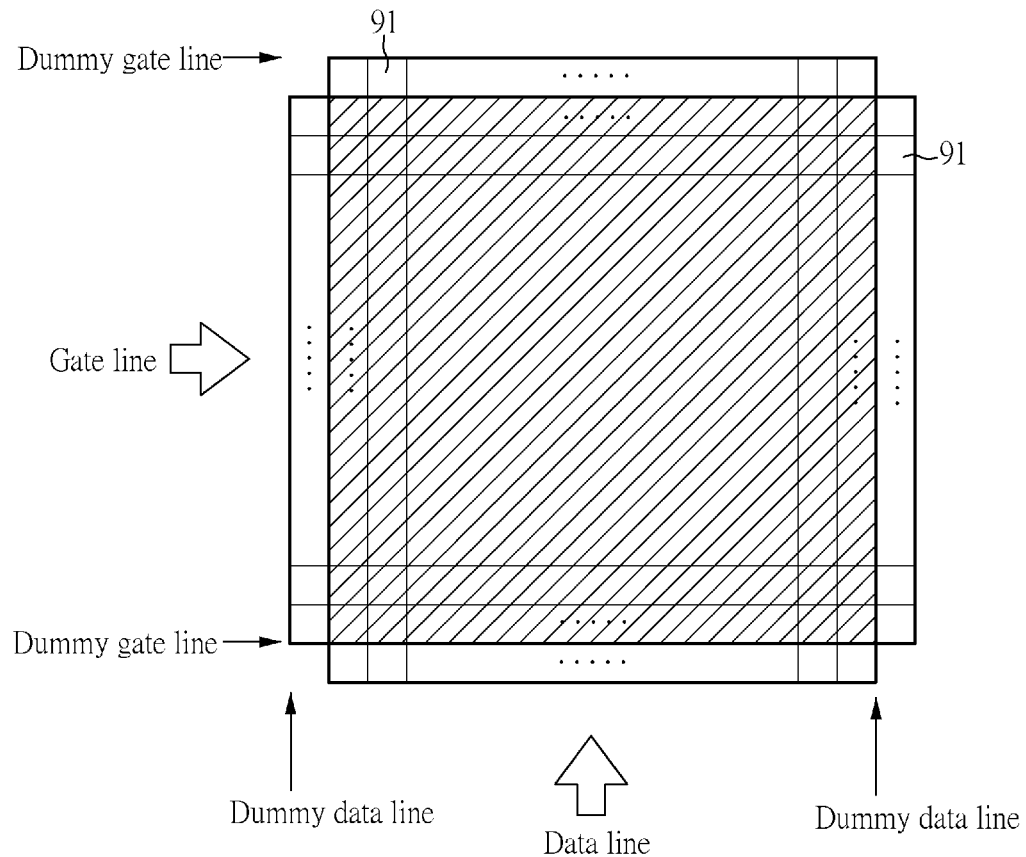
FIG. 1 is a schematic diagram of a prior display panel structure.
Figure 2:
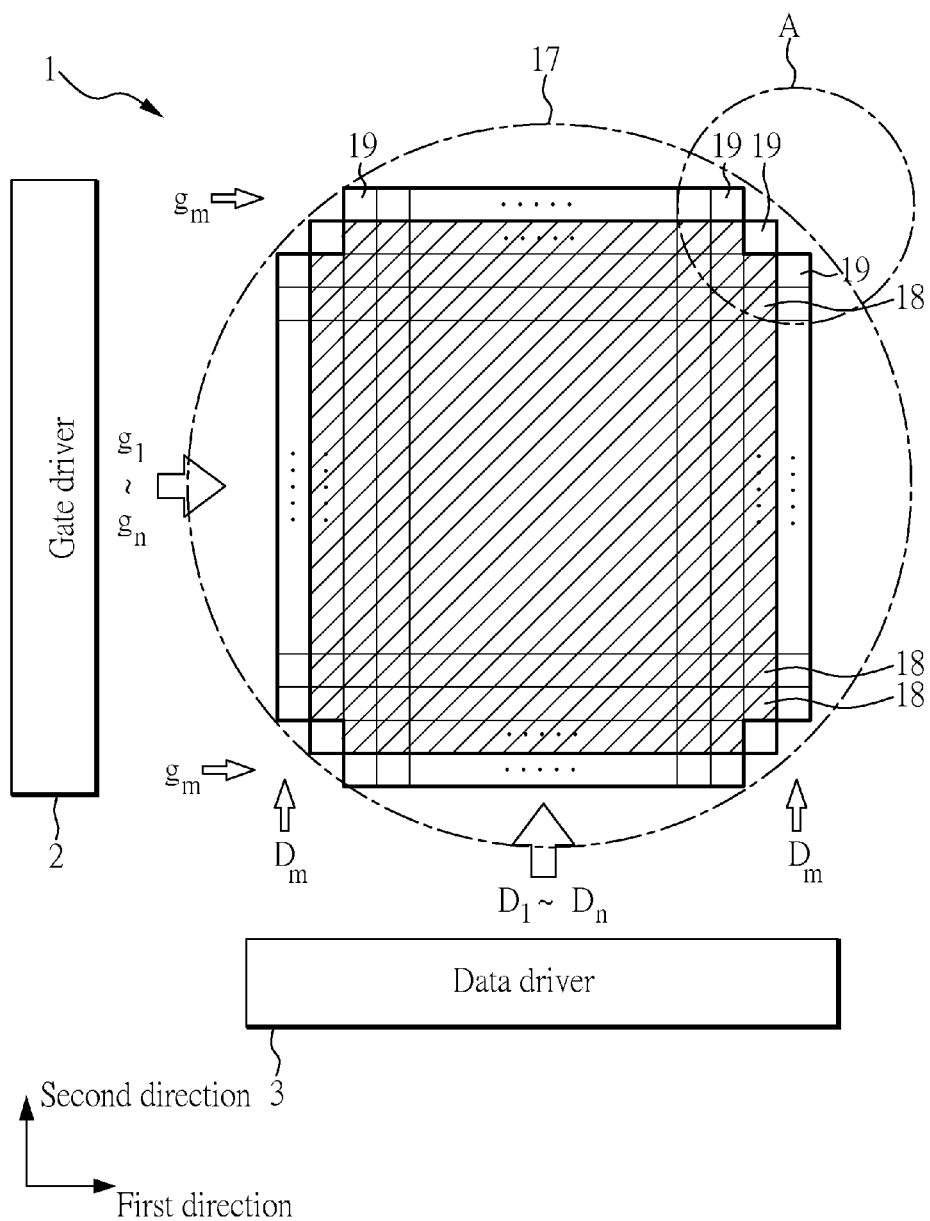
FIG. 2 is a schematic diagram of a display panel structure according to the present invention.

With reference to FIG. 2, there is shown a schematic diagram of a display panel structure according to the present invention. In this embodiment, the display panel structure 1 is, but not limited to, a round shaped display panel, while other non-rectangular displays are applicable to the display panel structure of the present invention. As shown in FIG. 2, the display panel structure of the present invention includes a substrate 17 (which is shown to have a round shape in the figure), a plurality of gate lines $g_1 \sim g_n$, at least one dummy gate line $g_m$, a gate driver 2, a plurality of data lines $D_1 \sim D_n$, at least one dummy data line $D_m$, a data driver 3, a plurality of pixels 18, and a plurality of dummy pixels 19. As shown in FIG. 2, the substrate 17 includes a display region (slash region) and a peripheral region (blank region), and the peripheral region surrounds the display region. The plurality of pixels 18 are disposed at the display region, and the plurality of dummy pixels 19 are disposed at the peripheral region. Besides, the plurality of gate lines $g_1 \sim g_n$ and the at least one dummy gate line $g_m$ can be formed simultaneously, and the plurality of data lines $D_1 \sim D_n$ and the at least one dummy data line $D_m$ can be formed simultaneously.

The plurality of gate lines $g_1 \sim g_n$ are arranged in parallel on the substrate 17 along a first direction, and the gate driver 2 is used for driving the plurality of gate lines $g_1 \sim g_n$. The plurality of data lines $D_1 \sim D_n$ are arranged in parallel on the substrate 17 along a second direction, which is not parallel with the first direction, and the data driver 3 is used for driving the plurality of data lines $D_1 \sim D_n$. The plurality of gate lines $g_1$~$g_n$ and the plurality of data lines $D_1$~$D_n$ are extended from the display region to the peripheral region. As shown in FIG. 2, the plurality of gate lines $g_1$~$g_n$, the at least one dummy gate line $g_m$, the plurality of data lines $D_1$~$D_n$, and the at least one dummy data line $D_m$ are intersected with each other. The at least one dummy gate line $g_m$ is arranged on the substrate 17 along the first direction, the at least one dummy data line $D_m$ is arranged on the substrate 17 along the second direction, and the at least one dummy gate line $g_m$ and the at least one dummy data line $D_m$ are arranged at the peripheral region.

Figure 3A:
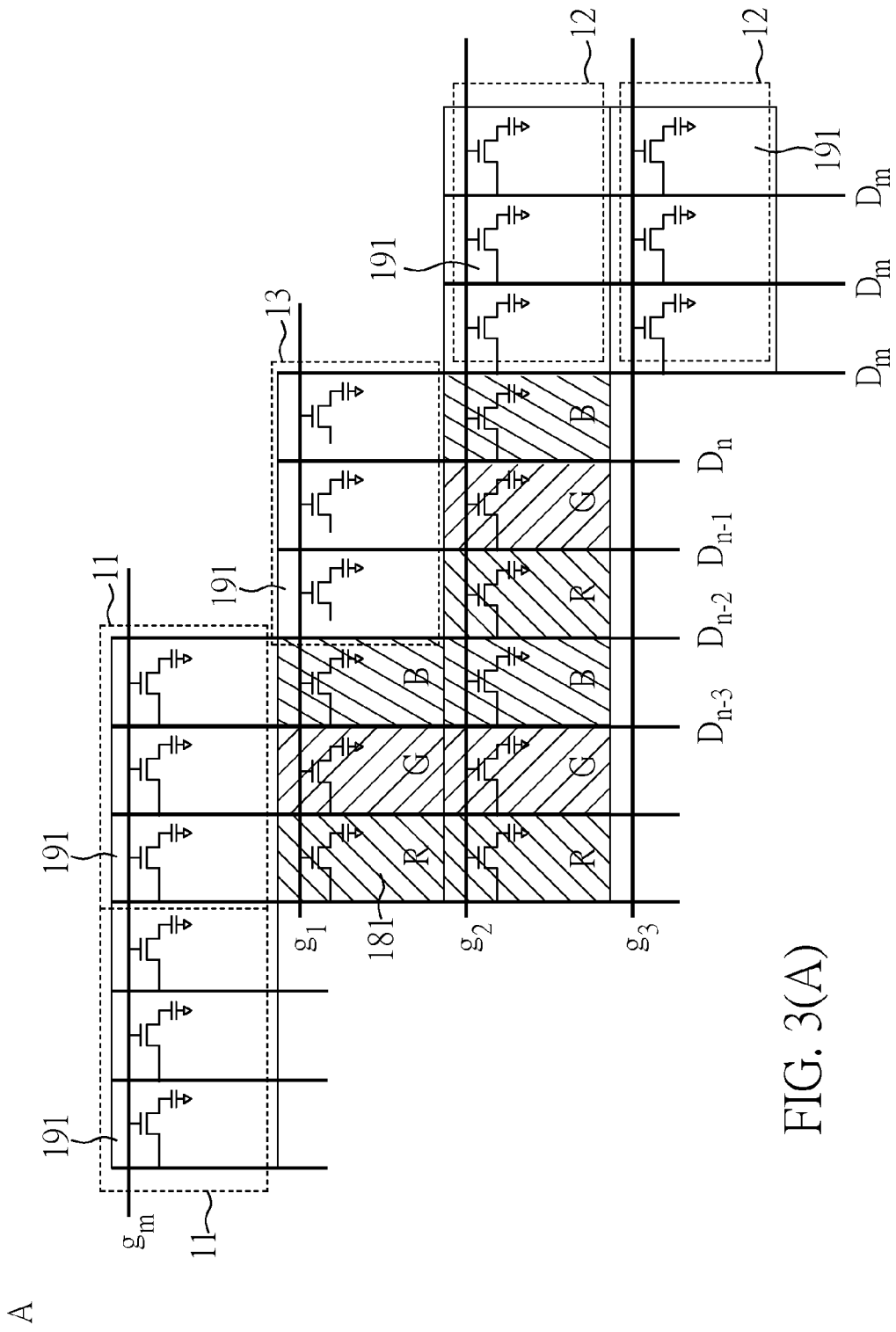
FIG. 3(A) schematically illustrates a part of the display panel structure in details according to a first embodiment of the present invention.

As shown in FIG. 3(A), it schematically illustrates a part A of the display panel structure in details according to a first embodiment of the present invention, which is a round shaped display panel for illustrative purpose only, wherein each pixel 18 includes three pixel units 181, i.e., red pixel unit (R), green pixel unit (G), and blue pixel unit (B). Each of the plurality of the pixel units 181 is defined by two adjacent gate lines and two adjacent data lines and has a thin film transistor including a gate electrode connected with one of the plurality of gate lines $g_1$~$g_n$ and a drain electrode or a source electrode connected to one of the plurality of data lines $D_1$~$D_n$.

As shown in FIG. 3(A), the plurality of dummy pixels 19 include a first region 11 of the plurality of dummy pixel units 191 arranged along the first direction, a second region 12 of the plurality of dummy pixel units 191 arranged along the second direction, and a third region 13 of the plurality of dummy pixel units 191 arranged between the first region 11 and the second region 12. The plurality of dummy pixel units 191 of the first region 11, the second region 12 and the third region 13 surround the plurality of the pixel units 181; that is, the peripheral region surrounds the display region. The plurality of dummy pixel units 191 of the third region 13 include one of the plurality of gate lines $g_1$~$g_n$ and one of the plurality of data lines $D_1$~$D_n$. Each of the dummy pixel units 191 of the first region 11, the second region 12 and the third region 13 has a thin film transistor. The thin film transistor of the dummy pixel units 191 of the first region 11 includes a gate electrode connected with the at least one dummy gate line $g_m$ and a drain electrode or a source electrode connected with one of the plurality of data lines $D_1$~$D_n$. The at least one dummy gate line $g_m$ passes through the first region 11 of the dummy pixel units 191. The thin film transistor of the dummy pixel units 191 of the second region 12 includes a gate electrode connected with one of the plurality of gate lines $g_1$~$g_n$ and a drain electrode or a source electrode connected with the at least one dummy data line $D_m$. The at least one dummy data line $D_m$ passes through the second region 12 of dummy pixel units 191. The thin film transistor of the dummy pixel units 191 of the third region 13 includes a gate electrode connected with one of the plurality of gate lines $g_1$~$g_n$, and a floating drain electrode or a floating source electrode which is that a drain electrode or a source electrode is disconnected to one of the plurality of data line $D_1$~$D_n$. In this embodiment, it illustrates the top-right side of the round shaped display panel structure 1, while similar arrangement can be applied at the top-left side, bottom-right, and bottom-left of the round shaped display panel structure 1.

Figure 3B:
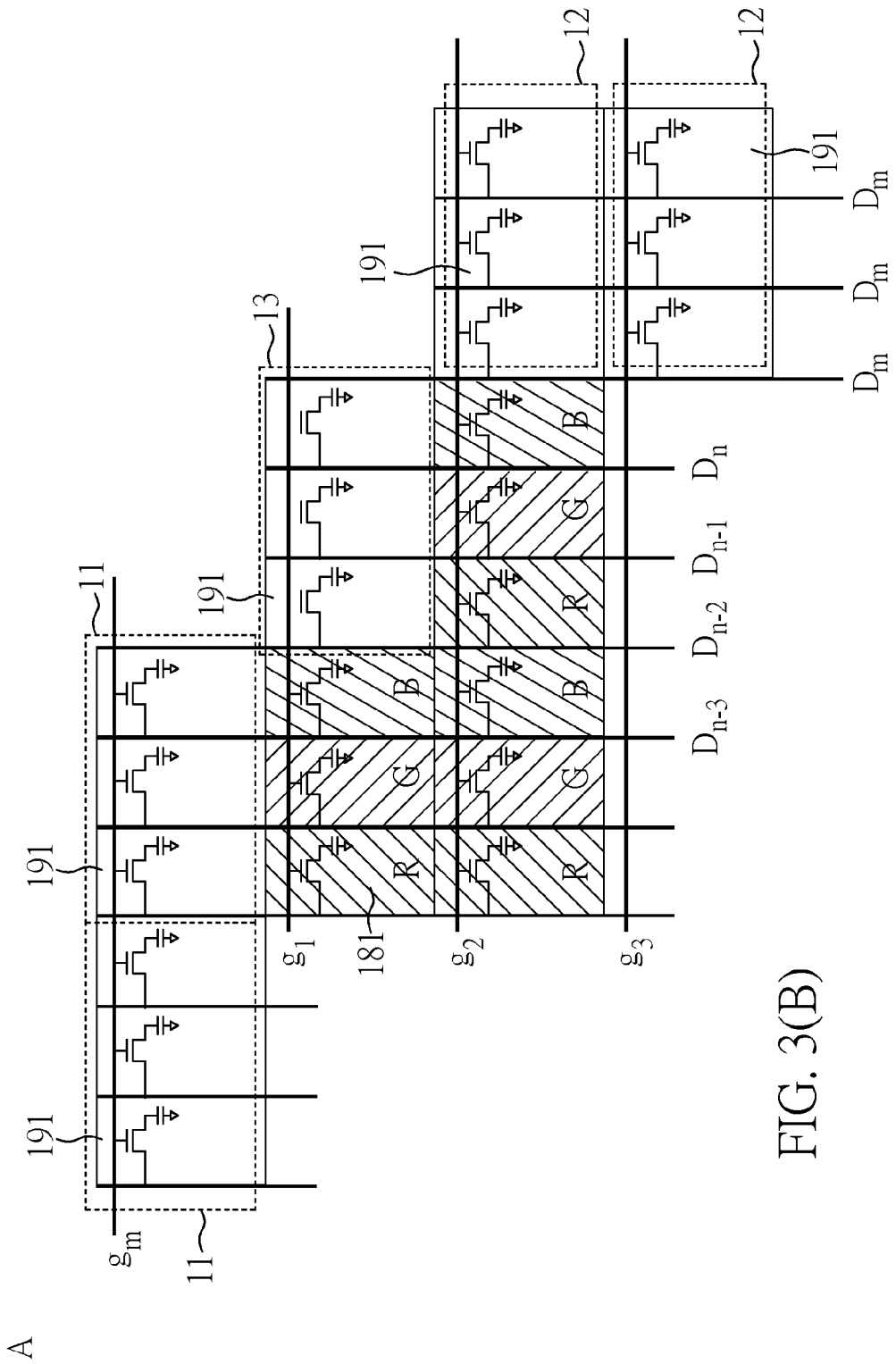
FIG. 3(B) schematically illustrates a part of the display panel structure in details according to a second embodiment of the present invention.

As shown in FIG. 3(B), it schematically illustrates a part A of the display panel structure in details according to a second embodiment of the present invention. The structure of this embodiment is similar to that of the first embodiment except that the thin film transistor of the dummy pixel units 191 of the third region 13 includes a floating gate electrode which is that a gate electrode is disconnected to one of the plurality of gate lines $g_1$~$g_n$, and a drain electrode or a source electrode connected with one of the plurality of data lines $D_1$~$D_n$.

Figure 3C:
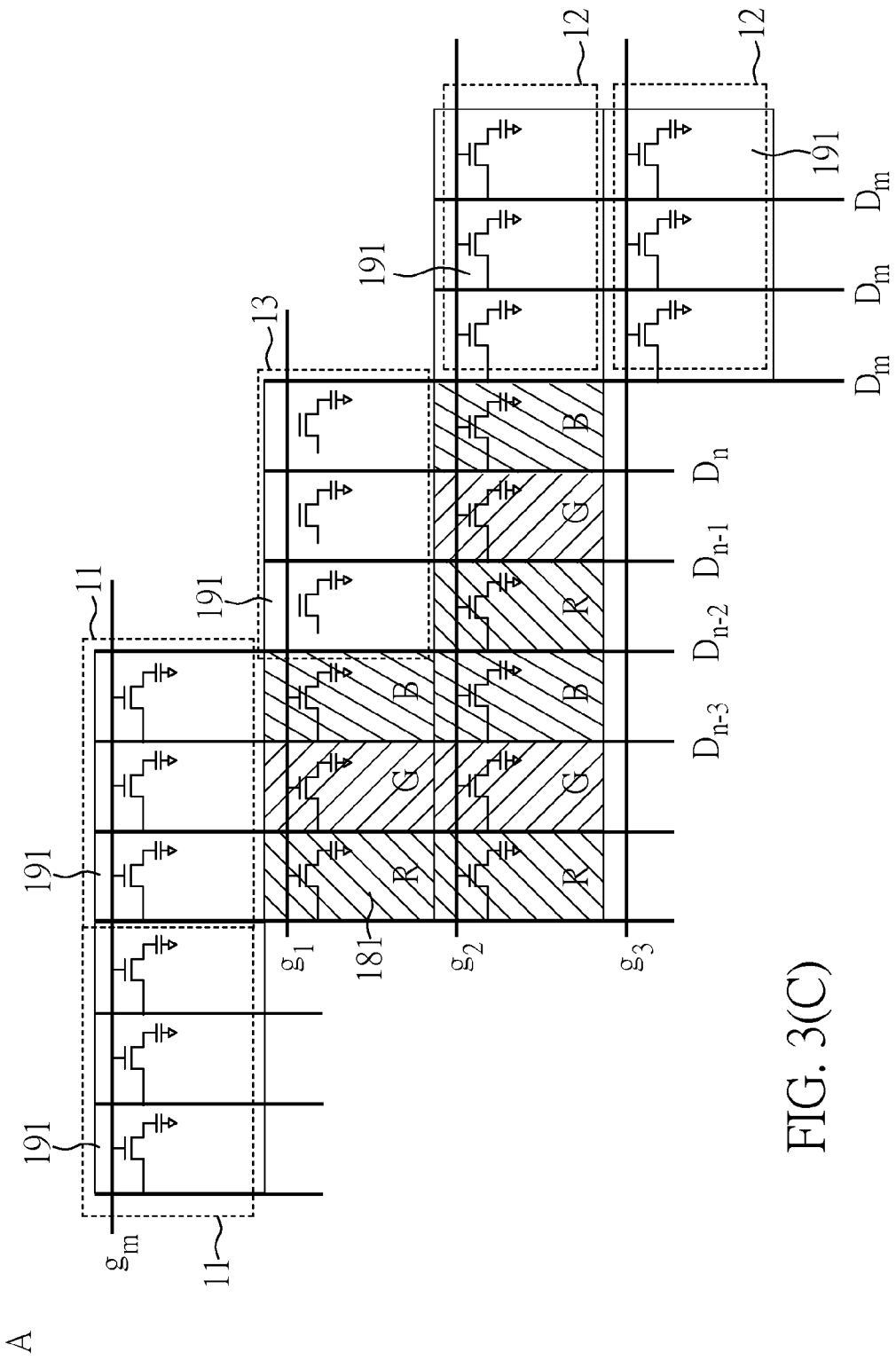
FIG. 3(C) schematically illustrates a part of the display panel structure in details according to a third embodiment of the present invention.

As shown in FIG. 3(C), it schematically illustrates a part A of the display panel structure in details according to a third embodiment of the present invention. The structure of this embodiment is similar to that of the first embodiment except that the thin film transistor of the dummy pixel units 191 of the third region 13 includes a floating gate electrode and a floating drain electrode or a floating source electrode.

Figure 4A:
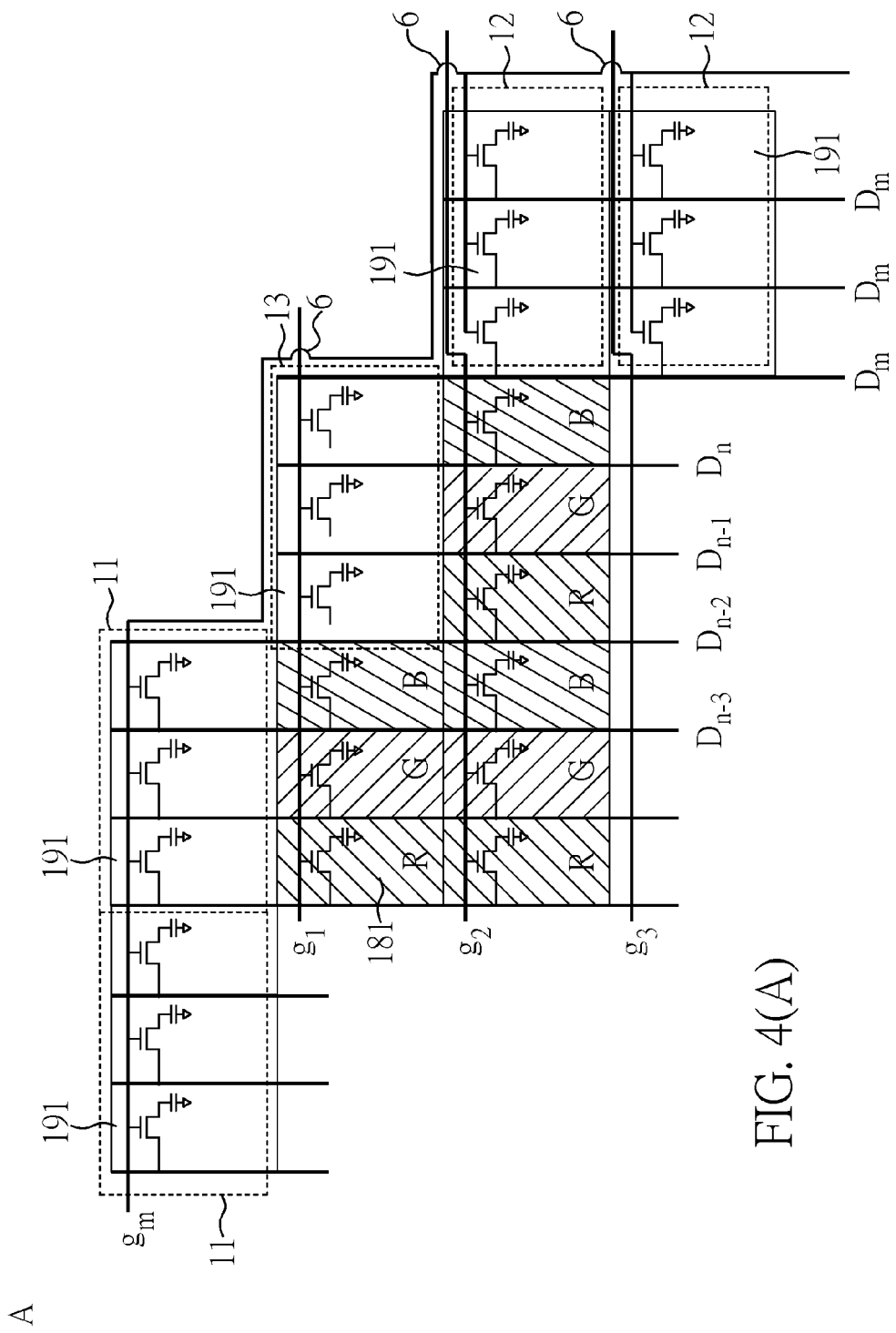
FIG. 4(A) schematically illustrates a part of the display panel structure in details according to a fourth embodiment of the present invention.
Figure 5:
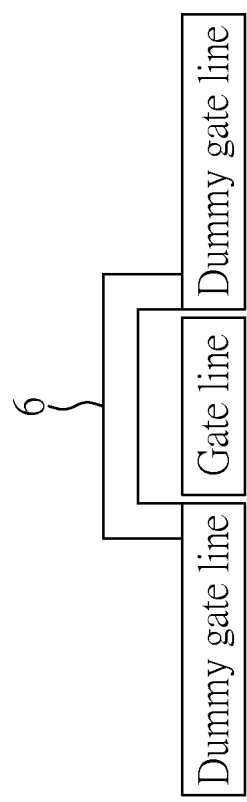
FIG. 5 schematically illustrates a bridge structure of the display panel structure according to the present invention.

With reference to FIG. 4(A), it schematically illustrates a part A of the display panel structure in details according to a fourth embodiment of the present invention. The structure of this embodiment is similar to that of the first embodiment except that the at least one dummy gate line $g_m$ further passes through the second region 12 of the dummy pixel units 191; the thin film transistor of the dummy pixel units 191 of the second region 12 includes a gate electrode connected with the at least one dummy gate line $g_m$, and a drain electrode or a source electrode connected with the at least one dummy data line $D_m$. Besides, with reference to FIG. 5, there is further provided a bridge structure 6 in the display panel structure of the present invention. The at least one dummy gate line $g_m$ includes at least one bridge 6 so that the at least one dummy gate line $g_m$ is across the plurality of gate lines $g_1$~$g_n$.

Figure 4B:
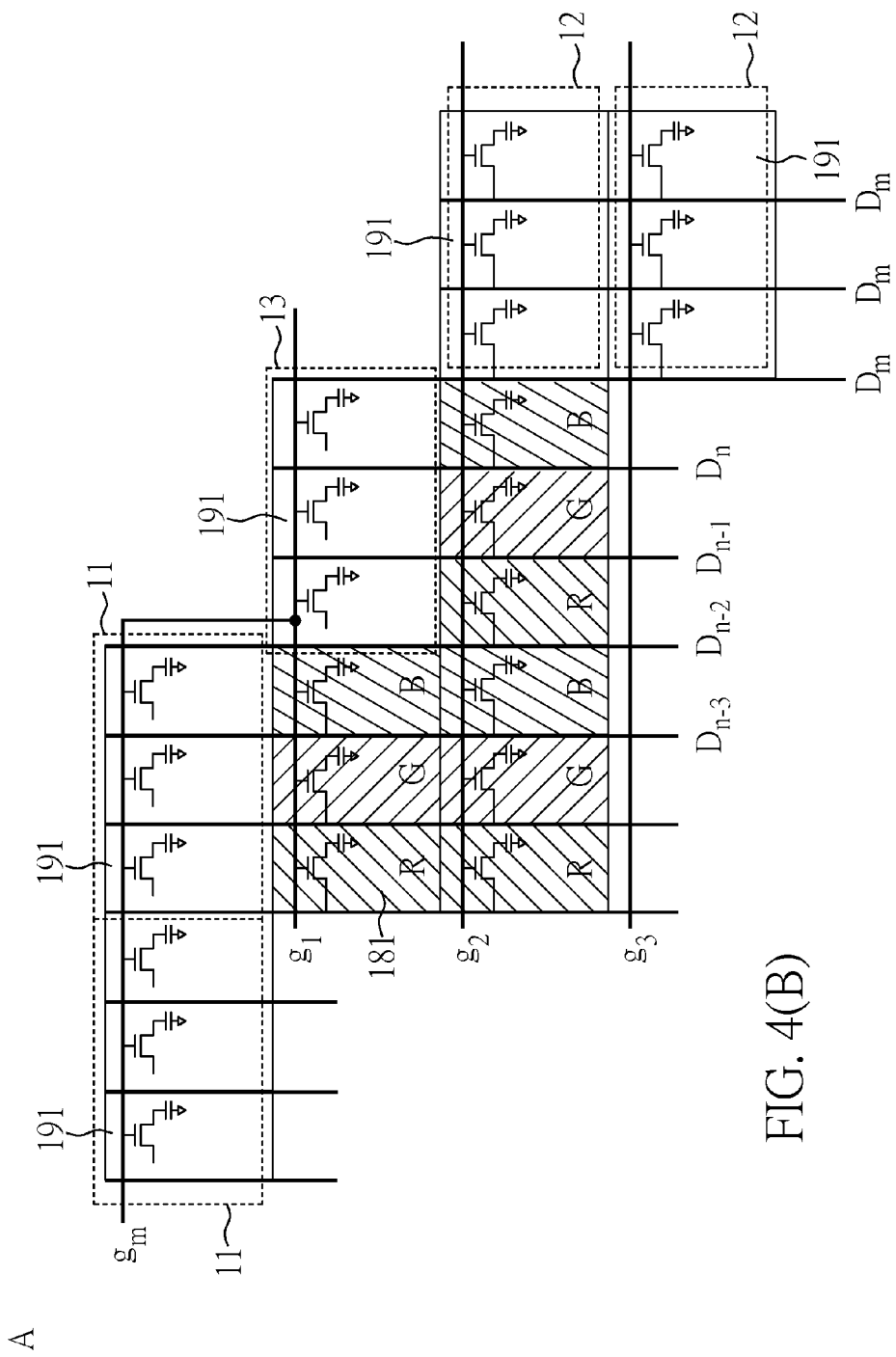
FIG. 4(B) schematically illustrates a part of the display panel structure in details according to a fifth embodiment of the present invention.

With reference to FIG. 4(B), it schematically illustrates a part A of the display panel structure in details according to a fifth embodiment of the present invention. The structure of this embodiment is similar to that of the first embodiment except that the at least one dummy gate line $g_m$ is connected with one of the plurality of gate lines $g_1$~$g_n$; the thin film transistor of the dummy pixel units 191 of the first region 11 includes a gate electrode connected with the at least one dummy gate line $g_m$, and a floating drain electrode or a floating source electrode.

Figure 4C:
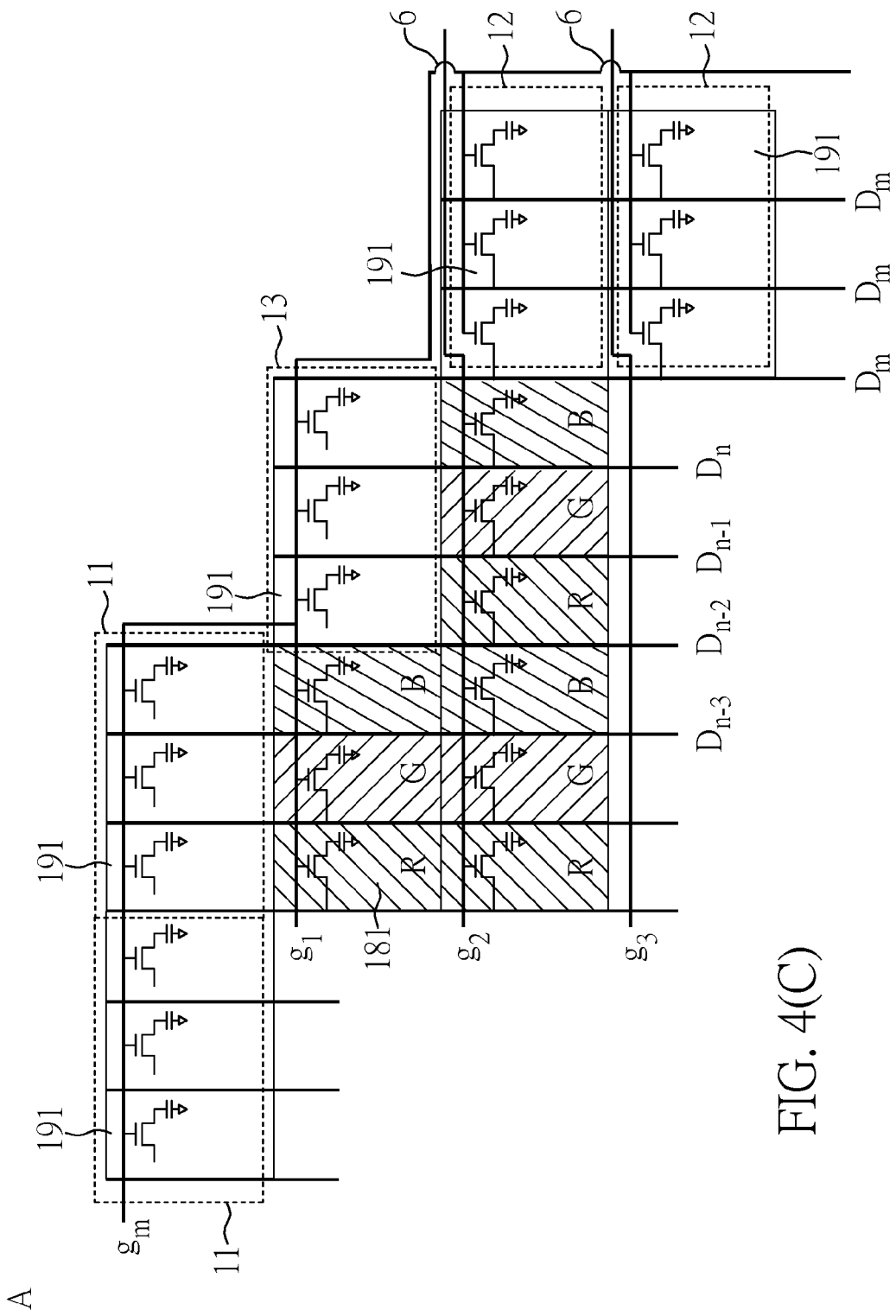
FIG. 4(C) schematically illustrates a part of the display panel structure in details according to a sixth embodiment of the present invention.

With reference to FIG. 4(C), it schematically illustrates a part A of the display panel structure in details according to a sixth embodiment of the present invention. The structure of this embodiment is similar to that of the first embodiment except that the at least one dummy gate line $g_m$ is connected with one of the plurality of gate lines $g_1$~$g_n$; the at least one dummy gate line $g_m$ further passes through the second region 12 of the dummy pixel units 191; the thin film transistor of the dummy pixel units 191 of the first region 11 includes a gate electrode connected with the at least one dummy gate line $g_m$, and a floating drain electrode or a floating source electrode; the thin film transistor of the dummy pixel units 191 of the second region 12 includes a gate electrode connected with the at least one dummy gate line $g_m$, and a drain electrode or a source electrode connected with the at least one dummy data line $D_m$. Besides, with reference to FIG. 5, the at least one dummy gate line $g_m$ includes at least one bridge 6 so that the at least one dummy gate line $g_m$ is across the plurality of gate lines $g_1$~$g_n$.

Figure 6A:
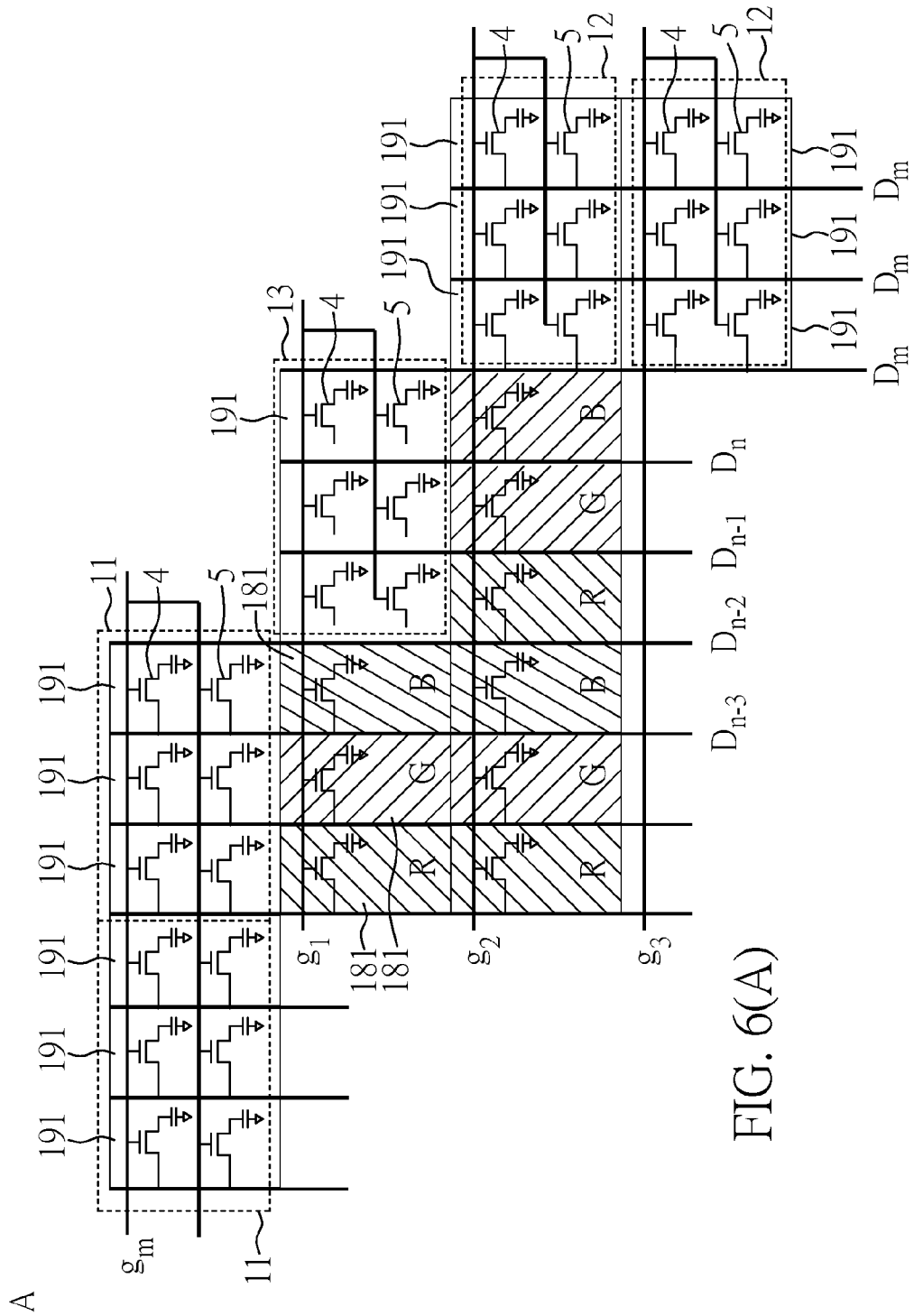
FIG. 6(A) schematically illustrates a part of the display panel structure in details according to a seventh embodiment of the present invention.

With reference to FIG. 6(A), it schematically illustrates a part A of the display panel structure in details according to a seventh embodiment of the present invention. The structure of this embodiment is similar to that of the first embodiment except that each dummy pixel 191 of the first region 11, the second region 12, and the third region 13 has a first thin film transistor 4 arranged at an upper location and a second thin film transistor 5 arranged at a lower location; the first and second thin film transistors 4, 5 of the dummy pixel units 191 of the first region 11 each includes a gate electrode connected with the at least one dummy gate line $g_m$ and a drain electrode or a source electrode connected with one of the plurality of data lines $D_1$~$D_n$; the first and second thin film transistors 4, 5 of the dummy pixel units 191 of the second region 12 each includes a gate electrode connected with one of the plurality of gate lines $g_1$~$g_n$, and a drain electrode or a source electrode connected with the at least one dummy data line $D_m$; the first and second thin film transistors 4, 5 of the dummy pixel units 191 of the third region 13 each includes a gate electrode connected with one of the plurality of gate lines $g_1$~$g_n$, and a floating drain electrode or a floating source electrode.

Figure 6B:
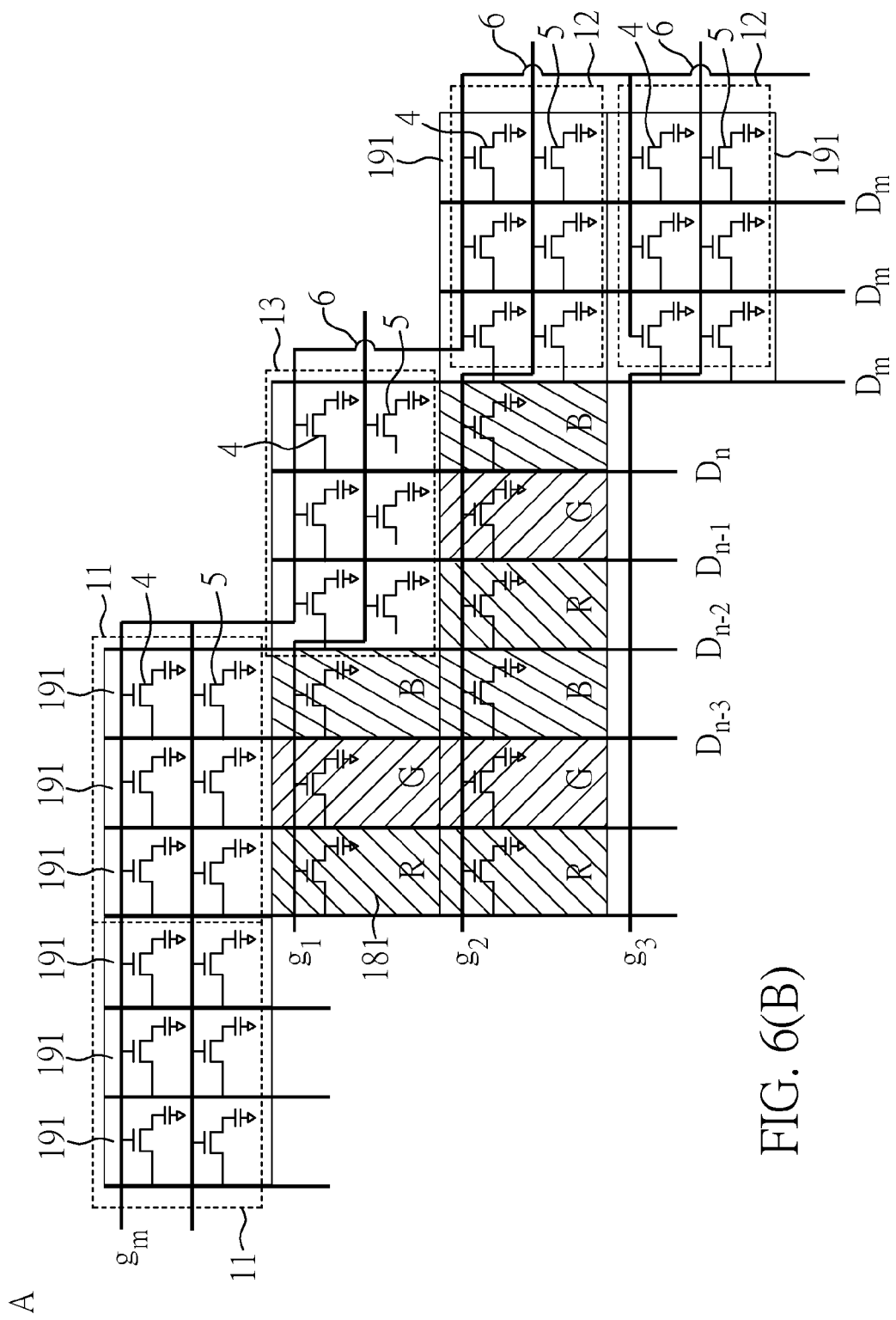
FIG. 6(B) schematically illustrates a part of the display panel structure in details according to an eighth embodiment of the present invention.

With reference to FIG. 6(B), it schematically illustrates a part A of the display panel structure in details according to an eighth embodiment of the present invention. The structure of this embodiment is similar to that of the seventh embodiment except that the at least one dummy gate line $g_m$ further passes through the second region 12 of the dummy pixel units 191 and the third region 13 of the dummy pixel units 191; the first thin film transistors 4 of the dummy pixel units 191 of the second region 12 and third region 13 includes a gate electrode connected with the at least one dummy gate line $g_m$; the first thin film transistor 4 of the dummy pixel units 191 of the third region 13 includes a drain electrode or a source electrode connected with one of the plurality of data lines $D_1$~$D_n$. Besides, with reference to FIG. 5, the at least one dummy gate line $g_m$ includes at least one bridge 6 so that the at least one dummy gate line $g_m$ is across the plurality of gate lines $g_1$~$g_n$.

Figure 6C:
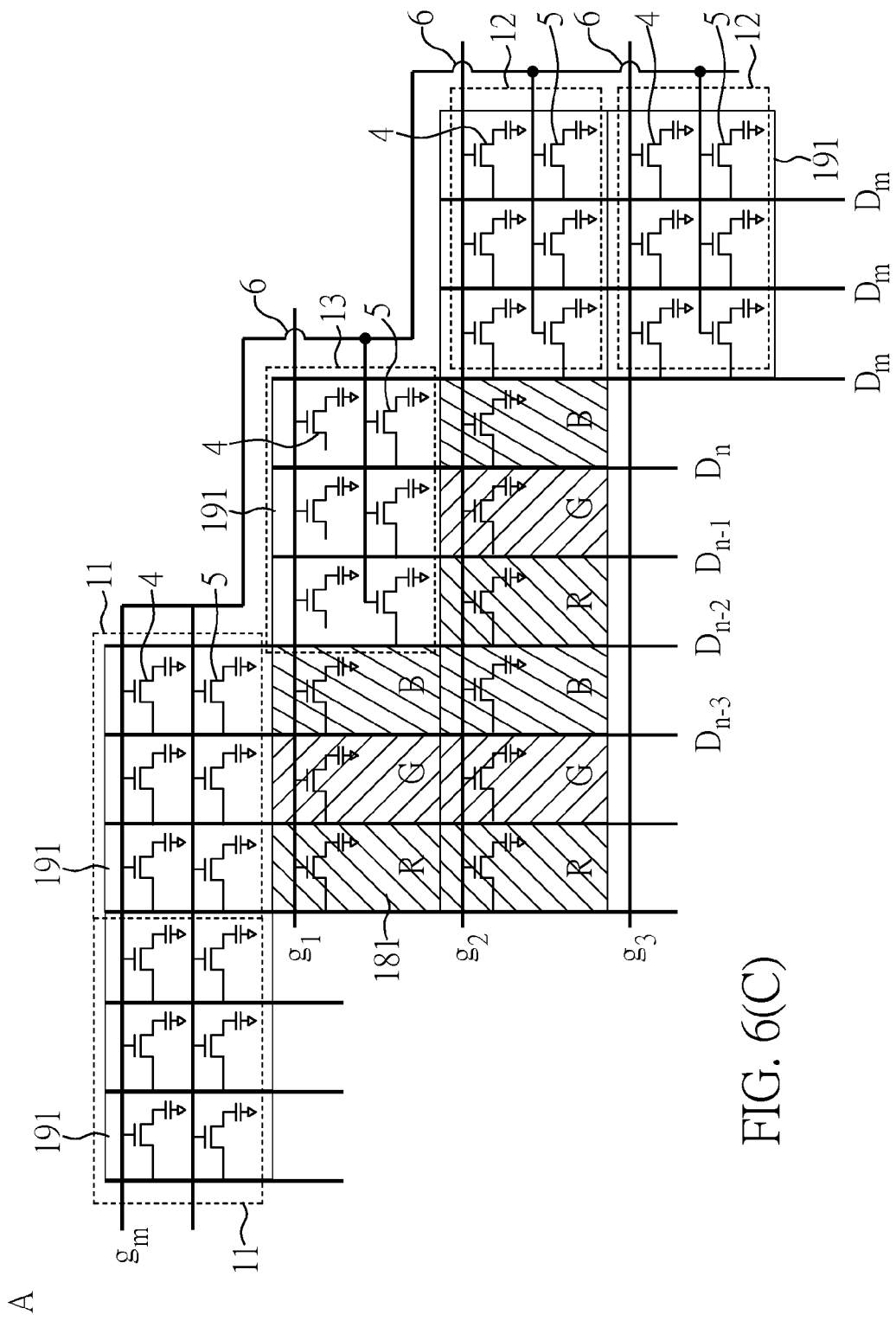
FIG. 6(C) schematically illustrates a part of the display panel structure in details according to a ninth embodiment of the present invention.

With reference to FIG. 6(C), it schematically illustrates a part A of the display panel structure in details according to a ninth embodiment of the present invention. The structure of this embodiment is similar to that of the seventh embodiment except that the at least one dummy gate line $g_m$ further passes through the second region 12 of the dummy pixel units 191 and the third region 13 of the dummy pixel units 191; the second thin film transistor 5 of the dummy pixel units 191 of the second region 12 and the third region 13 includes a gate electrode connected with the at least one dummy gate line $g_m$; the second thin film transistor 5 of the dummy pixel units 191 of the third region 13 includes a drain electrode or a source electrode connected with one of the plurality of data lines $D_1$~$D_n$. Besides, with reference to FIG. 5, the at least one dummy gate line $g_m$ includes at least one bridge 6 so that the at least one dummy gate line $g_m$ is across the plurality of gate lines $g_1$~$g_n$.

With the aforementioned dummy pixel circuit arrangement, a free shaped display panel structure can be provided with different dummy pixel unit structure thereby providing the display panel with the effect of electrostatic discharge protection.

Although the present invention has been explained in relation to its preferred embodiment, it is to be understood that many other possible modifications and variations can be made without departing from the spirit and scope of the invention as hereinafter claimed.

What is claimed is:

1. A display panel structure, comprising:
   a substrate having a display region and a peripheral region, the peripheral region surrounding the display region;
   a plurality of gate lines arranged in parallel on the substrate along a first direction, wherein the plurality of gate lines are extended from the display region to the peripheral region;
   a plurality of data lines arranged in parallel on the substrate along a second direction, which is not parallel with the first direction, wherein the plurality of data lines are extended from the display region to the peripheral region;
   a plurality of pixel units disposed at the display region, each of the plurality of the pixel units being defined by two adjacent gate lines and two adjacent data lines; and
   a plurality of dummy pixel units disposed at the peripheral region including a first region of the plurality of dummy pixel units, a second region of the a plurality of dummy pixel units, and a third region of the a plurality of dummy pixel units, wherein the dummy pixel units of the first region are arranged along the first direction, the dummy pixel units of the second region are arranged along the second direction, and the dummy pixel units of the third region are arranged between the first region and the second region, and wherein the dummy pixel units of the third region include one of the plurality of gate lines and one of the plurality of data lines,
   wherein at least one of the dummy pixel units of the third region has a thin film transistor including a source electrode and a drain electrode, the drain electrode and the source electrode are disconnected to the data line.

2. The display panel structure as claimed in claim 1, further comprising:
   a gate driver for driving the plurality of gate lines; and
   a data driver for driving the plurality of data lines.

3. The display panel structure as claimed in claim 1, wherein each of the dummy pixel units of the third region has a thin film transistor including a gate electrode connected with one of the plurality of gate lines.

4. The display panel structure as claimed in claim 1, wherein each of the dummy pixel units of the third region has a thin film transistor including a floating gate electrode.

5. The display panel structure as claimed in claim 1, further comprising:
   at least one dummy gate line arranged on the substrate along the first direction for passing through the dummy pixel units of the first region, the dummy gate line being disposed at the peripheral region; and
   at least one dummy data line arranged on the substrate along the second direction for passing through the dummy pixel units of the second region, the dummy data line being disposed at the peripheral region.

6. The display panel structure as claimed in claim 5, wherein each of the dummy pixel units of the first region has at least one thin film transistor including a gate electrode connected with the dummy gate line and a drain electrode or a source electrode connected with one of the plurality of data lines.

7. The display panel structure as claimed in claim 6, wherein each of the dummy pixel units of the second region has at least one thin film transistor including a gate electrode connected with one of the plurality of gate lines and a drain electrode or a source electrode connected with the dummy data line.

8. The display panel structure as claimed in claim 6, wherein the dummy gate line further passes through the dummy pixel units of the second region.

9. The display panel structure as claimed in claim 8, wherein each of the dummy pixel units of the second region has at least one thin film transistor including a gate electrode connected with the dummy gate line and a drain electrode or a source electrode connected with the dummy data line.

10. The display panel structure as claimed in claim 5, wherein the dummy gate line is connected with one of the plurality of gate lines.

11. The display panel structure as claimed in claim 5, wherein each of the dummy pixel units of the third region has a first thin film transistor and a second thin film transistor.

12. The display panel structure as claimed in claim 11, wherein the first thin film transistor includes a gate electrode connected with the dummy gate line and a drain electrode or a source electrode connected with the dummy data line or a floating drain electrode or a floating source electrode, and the second thin film transistor includes a gate electrode connected with one of the plurality of gate lines and a floating drain electrode or a floating source electrode.

13. A display panel structure, comprising:
- a substrate having a display region and a peripheral region, the peripheral region surrounding the display region;
- a plurality of gate lines arranged in parallel on the substrate along a first direction, wherein the plurality of gate lines are extended from the display region to the peripheral region;
- a plurality of data lines arranged in parallel on the substrate along a second direction, which is not parallel with the first direction, wherein the plurality of data lines are extended from the display region to the peripheral region;
- a plurality of pixel units disposed at the display region, each of the plurality of the pixel units being defined by two adjacent gate lines and two adjacent data lines; and
- a plurality of dummy pixel units disposed at the peripheral region including a first region of the plurality of dummy pixel units, a second region of the a plurality of dummy pixel units, and a third region of the a plurality of dummy pixel units, wherein the dummy pixel units of the first region are arranged along the first direction, the dummy pixel units of the second region are arranged along the second direction, and the dummy pixel units of the third region are arranged between the first region and the second region, and wherein the dummy pixel units of the third region include one of the plurality of gate lines and one of the plurality of data lines, a dummy gate line includes at least one bridge to connect the dummy pixel units of the first region and the dummy pixel units of the second region, and the dummy gate line is across and intersected with at least one of the plurality of gate lines.

14. The display panel structure as claimed in claim 13, wherein each of the dummy pixel units of the first region has at least one thin film transistor including a gate electrode connected with the dummy gate line and a floating drain electrode or a floating source electrode.

15. The display panel structure as claimed in claim 14, wherein each of the dummy pixel units of the second region has at least one thin film transistor including a gate electrode connected with one of the plurality of gate lines and a drain electrode or a source electrode connected with the dummy data line.

16. The display panel structure as claimed in claim 14, wherein the dummy gate line further passes through the dummy pixel units of the second region.

17. The display panel structure as claimed in claim 16, wherein each of the dummy pixel units of the second region has at least one thin film transistor including a gate electrode connected with the dummy gate line and a drain electrode or a source electrode connected with the dummy data line.

* * * * *